United States Patent
Dierickx

(10) Patent No.: US 6,815,791 B1
(45) Date of Patent: Nov. 9, 2004

(54) BURIED, FULLY DEPLETABLE, HIGH FILL FACTOR PHOTODIODES

(75) Inventor: Bart Dierickx, Mortsel (BE)

(73) Assignee: FillFactory

( * ) Notice: Subject to any disclaimer, the term of this patent is extended or adjusted under 35 U.S.C. 154(b) by 0 days.

(21) Appl. No.: 09/460,630

(22) Filed: Dec. 14, 1999

Related U.S. Application Data

(63) Continuation-in-part of application No. 09/021,010, filed on Feb. 9, 1998, now Pat. No. 6,225,670.
(60) Provisional application No. 60/037,531, filed on Feb. 10, 1997.

(30) Foreign Application Priority Data

Jun. 4, 1997 (EP) .............................................. 97870084

(51) Int. Cl.$^7$ .............................................. H01L 31/06
(52) U.S. Cl. ........................ 257/461; 257/215; 257/222; 257/225; 257/236; 257/239; 257/462; 257/233; 257/292
(58) Field of Search ........................ 257/83, 222, 225, 257/184, 461, 448, 447, 460, 462, 446, 233, 232, 292, 458, 215; 438/60, 75, 144

(56) References Cited

U.S. PATENT DOCUMENTS

| | | | |
|---|---|---|---|
| 4,148,048 A | * | 4/1979 | Takemoto et al. ............. 357/30 |
| 4,389,661 A | * | 6/1983 | Yamada ........................ 357/24 |
| 4,473,836 A | | 9/1984 | Chamberlain |
| 4,484,210 A | * | 11/1984 | Shiraki et al. ................. 357/24 |
| 4,498,013 A | * | 2/1985 | Kuroda et al. .............. 250/578 |
| 4,565,756 A | | 1/1986 | Needs et al. |
| 4,580,103 A | | 4/1986 | Tompsett |
| 4,630,091 A | * | 12/1986 | Kuroda et al. ................ 357/30 |
| 4,647,975 A | | 3/1987 | Alston et al. |
| 4,774,557 A | * | 9/1988 | Kosonocky ................... 357/24 |
| 4,914,493 A | * | 4/1990 | Shiromizu .................... 357/24 |
| 4,951,105 A | * | 8/1990 | Yamada ....................... 257/444 |
| 4,984,044 A | * | 1/1991 | Yamamura ................... 357/24 |
| 4,984,047 A | * | 1/1991 | Stevens ....................... 357/30 |
| 5,101,253 A | | 3/1992 | Mizutani et al. |
| 5,146,074 A | | 9/1992 | Kawahara et al. |

(List continued on next page.)

FOREIGN PATENT DOCUMENTS

| | | |
|---|---|---|
| EP | 548 987 | 6/1993 |
| EP | 657 863 | 6/1995 |
| EP | 739 039 | 10/1996 |
| GB | 2324651 | 10/1998 |
| WO | 93/19489 | 9/1993 |

OTHER PUBLICATIONS

Aoki et al., "A Collinear 3–Chip Image Sensor", *IEEE International Solid–State Circuits Conference*, 1985, pp. 102–103.

Horii et al., "A 490 x 404 Element Imager for a Single–Chip Color Camera", *IEEE International Solid–State Circuits Conference*, 1985, pp. 96–97.

Nagakawa et al., "A 580 x 500–Element CCD Imager with a Shallow Flat P Well", *IEEE International Solid–State Circuits Conference*, 1985, pp. 98–99.

(List continued on next page.)

*Primary Examiner*—Tom Thomas
*Assistant Examiner*—Eugene Lee
(74) *Attorney, Agent, or Firm*—Knobbe Martens Olson & Bear LLP

(57) ABSTRACT

A semiconductor detector of electromagnetic radiation which utilizes a dual-purpose electrode which extends significantly beyond the edge of a photodiode. This configuration reduces the sensitivity of device performance on small misalignments between manufacturing steps while reducing dark currents, kTC noise, and "ghost" images. The collection-mode potential of the dual-purpose electrode can be adjusted to achieve charge confinement and enhanced collection efficiency, reducing or eliminating the need for an additional pinning layer. Finally, the present invention enhances the fill factor of the photodiode by shielding the photon-created charge carriers formed in the substrate from the potential wells of the surrounding circuitry.

11 Claims, 4 Drawing Sheets

U.S. PATENT DOCUMENTS

| | | | |
|---|---|---|---|
| 5,153,420 A | | 10/1992 | Hack et al. |
| 5,164,832 A | | 11/1992 | Halvis et al. |
| 5,191,398 A | * | 3/1993 | Mutoh .......................... 257/216 |
| 5,196,719 A | * | 3/1993 | Miwada ....................... 257/225 |
| 5,258,845 A | | 11/1993 | Kyuma et al. |
| 5,296,696 A | | 3/1994 | Uno |
| 5,307,169 A | * | 4/1994 | Nagasaki et al. ............ 348/307 |
| 5,321,528 A | | 6/1994 | Nakamura |
| 5,335,008 A | | 8/1994 | Hamasaki |
| 5,578,842 A | * | 11/1996 | Shinji ........................... 257/223 |
| 5,587,596 A | * | 12/1996 | Chi et al. ..................... 257/223 |
| 5,608,204 A | | 3/1997 | Hofflinger et al. |
| 5,608,243 A | * | 3/1997 | Chi et al. .................... 257/249 |
| 5,614,744 A | | 3/1997 | Merrill |
| 5,625,210 A | | 4/1997 | Lee et al. |
| 5,668,390 A | * | 9/1997 | Morimoto .................... 257/232 |
| 5,754,228 A | * | 5/1998 | Dyck ........................... 348/266 |
| 5,841,126 A | | 11/1998 | Fossum |
| 5,841,159 A | * | 11/1998 | Lee et al. .................... 257/291 |
| 5,872,371 A | * | 2/1999 | Guidash et al. ............. 257/230 |
| 5,898,196 A | * | 4/1999 | Hook et al. .................. 257/292 |
| 5,903,021 A | | 5/1999 | Lee et al. |
| 5,904,493 A | | 5/1999 | Lee et al. |
| 5,952,686 A | * | 9/1999 | Chou et al. .................. 257/292 |
| 5,955,753 A | * | 9/1999 | Takahashi .................... 257/292 |
| 5,977,576 A | * | 11/1999 | Hamasaki .................... 257/292 |
| 6,051,857 A | * | 4/2000 | Miida ........................... 257/292 |
| 6,107,655 A | * | 8/2000 | Guidash ....................... 257/233 |
| 6,111,271 A | * | 8/2000 | Snyman et al. ................ 257/80 |
| 6,115,066 A | * | 9/2000 | Gowda et al. ............... 348/308 |
| 6,136,629 A | * | 10/2000 | Sin ............................... 438/48 |
| 6,194,702 B1 | * | 2/2001 | Hook et al. ............. 250/214 A |

OTHER PUBLICATIONS

Mahowald, M.A., "Silicon Retina with Adaptive Photoreceptors", *SPIE,* vol. 1473, 1991, pp. 52–58.

Mann, J. "Implementing Early Visual Processing In Analog VLSI: Light Adaptation", *SPIE,* vol. 1473, 1991, pp. 128–136.

Ono et al., "Analysis of Smear Noise In Interline–CCD Image Sensor with Gate–Free Isolation Structure", Abstract of the 1991 Int'l Conference on Solid State Devices and Materials, Yokohama, 1991, pp. 68–70.

Yadid–Pecht et al., "A Random Access Photodiode Array for Intelligent Image Capture", *IEEE Transactions on Electron Devices,* vol. 38, No. 8, Aug. 1991.

Ricquier et al., "Pixel Structure with Logarithmic Response for Intelligent and Flexible Imager Architectures", *Microelectronic Engineering,* 19 (1992), pp. 631–634.

Stevenhans, et al., "A 400mm Long Linear X–Ray Sensitive Image Sensor", *IEEE International Solid–State Circuits Conference,* 1987, pp. 108–109.

Anderson, S. et al., "A Single Chip Sensor & Image Processor or Fingerprint Verification", *IEEE 1991 Custom Integrated Circuits Conference,* May 12–15, 1991, pp. 12.1.1–12.1.4.

Dierickx, Bart, "XYW Detector: A Smart Two–Dimensional Particle Sensor", *Nuclear Instruments and Mthods in Physics Research A275,* North–Holland Physics Publishing Division, 1989, pp. 542–544.

Klein, P., "Design and Performance of Semiconductor Detectors with Integrated Amplification and Charge Storage Capability", *Nuclear Instruments and Methods in Physics Research A305,* 1991, pp. 517–526.

Aw, Chye Huat, et al., "A 128 x 128–Pixel Standard–CMOS Image Sensor with Electronic Shutter", *IEEE Journal of Solid State Circuits,* vol. 31, No. 12, Dec. 1996, pp. 1922–1930.

Martin, W.J. et al., "Dynamic Offset Null", *IBM Technical Disclosure Bulletin,* No. 23, No. 9, Feb. 1981, pp. 4195–4196.

* cited by examiner

BURIED, FULLY DEPLETABLE, HIGH FILL FACTOR PHOTODIODES

This application is a continuation-in-part of application Ser. No. 09/021,010 filed Feb. 9, 1998, the entire contents thereof being incorporated by reference herein, and claims priority to European Application No. 97870084.7 dated Apr. 6, 1997 and is related to and claims the benefit of the filing date of prior filed U.S. Provisional Patent Application No. 60/037,531 filed Oct. 2, 1997.

BACKGROUND OF THE INVENTION

1. Field of the Invention

The present invention relates to active pixel solid state photosensors and imagers using CMOS technology.

2. Description of the Related Art

Active pixel solid state sensors and devices for detecting electromagnetic radiation are well known and in widespread use. When mounted in camera systems, pixel arrays serve as vision or image sensors which produce electrical signals corresponding to the detected light levels. Examples of such photosensors are disclosed in EP739039 and in WO93/19489. These sensors, implemented using CMOS- or MOS-technology, utilize collection junctions which are regions adapted for collecting charges generated by radiation in the semiconductor substrate. The collection junctions are either p-n or n-p junctions, depending on whether the substrate is of p-type or n-type conductivity, respectively.

An active pixel is configured with circuitry integrated in the pixel to amplify the charge that is collected on the light sensitive element or component in the pixel. Active pixels may also be equipped with additional electronics for more elaborate functions, such as filtering, high speed operation, or operation in more extreme illumination conditions. Conversely, passive pixels do not have such circuitry, so they require charge-sensitive amplifiers which are connected to the pixel via a conductive wire or line of metallization. However, one primary drawback of active pixel CMOS or MOS sensors is that a significant part of the pixel surface is used for the detection circuitry, thereby limiting the collection area for each pixel.

Because all photon-generated charges within a recombination length from the collection junction have a chance of diffusing to, and being collected by, the junction, the charge sensitive volume of a collection junction is larger than the junction's depletion layer. Based on this mechanism, a sensor with a small collection junction can have a larger photosensitive volume. For example, photosensors with an apparent front size or photosensitive region of approximately 30 $\mu$m diameter can be made with junctions of 3 $\mu$m by 2 $\mu$m and with a recombination length of 15 $\mu$m. However, for active pixels which contain other circuitry (e.g. detection circuitry), some charges that would otherwise have reached the collection junction are instead captured by the junctions or components of the additional circuitry. These charges taken by the pixel's additional circuitry are therefore lost and do not contribute to the detected signal. This is a principal reason for the low fill factor or low sensitivity of active pixel sensors.

It is known in the art that photodiode dark current (i.e. current not caused by detected electromagnetic radiation) is primarily due to thermal generation of charge carriers at the edges of the photodiode, or at the interface between the silicon and $SiO_2$. This dark current can be significantly reduced by a method called "inversion mode" or "all phase pinning" in which the Si—$SiO_2$ interface is brought into inversion by applying a dopant layer to the surface of the photodiode. This dopant layer prevents contact between the buried channel (i.e. the useful collecting junction) and the Si—$SiO_2$ interface. This method typically reduces the dark current two orders of magnitude.

An example of an active pixel device prior to the present invention is represented by Lee et al., U.S. Pat. No. 5,625, 210 "ACTIVE PIXEL SENSOR INTEGRATED WITH A PINNED PHOTODIODE", which illustrates integrating a n-well CMOS pinned photodiode with a transfer gate into an image sensing element of an active pixel element. As shown in FIG. 1, the p-type substrate 24 forms a p-n photodiode with the n-region 22 which becomes the photoactive element and stores the photoelectrons created by photons impinging onto the pixel. "Burying" the n-well 22 under a p+ pinning region 20 confines the collected photoelectrons in the deeper n-region. Because the photodiode junction is then prevented from touching the Si—$SiO_2$ interface 30, the generation of dark current at generation centers at the interface is suppressed. The electrostatic potential created by the pinning dopant region 20 also reduces the influence of any oxide layer charge on the junction potential. Such photodiodes also have better ionization radiation tolerances.

The pinning dopant region 20 of the photodiode also reduces the capacitance of the collection junction, which reduces the kTC noise of the sensor and the possibility of "ghost" images; i.e. relics of prior frames' bright images in subsequent dark frames. The so-called kTC noise, one of the primary sources of noise in imaging sensors, is typically expressed as an amount of noise charge (i.e. uncertainty of the measurements of the photo-generated charge), and it is proportional to the square root of the capacitance of the collection junction. Therefore any reduction of capacitance equates to a reduction of the kTC noise. The pinning dopant layer 20 reduces the capacitance of the collection junction by raising the minimum of the electrostatic potential well in which the photoelectrons are confined. When this potential well is shallower than the transfer bias of the transfer gate 28, the photodiode can be completely depleted or reset in a shorter amount of time. Therefore, with a sufficient reduction of the sensor's capacitance by the pinning dopant layer 20, all of the photoelectrons can be transferred to the detection circuitry n-well 26 by turning on the transfer gate 28, leaving no charge in the potential well to contribute to a later frame's image.

A MOSFET is formed by the transfer gate 28 above the p-type substrate 24 between the charge collection n-well 22 and the CMOS detection circuitry n-well 26. Application of a sufficient voltage to the transfer gate 28 forms a depletion region between the two n-wells 22 and 26, thereby providing an n-channel for charge transfer between the pinned photodiode and the floating diffusion CMOS detection circuitry. The transfer gate 28 is the gate or electrode that controls the conditional transfer of charges between a photodiode (or other structure containing charge, e.g. a storage gate) to a register. The sole function of the transfer gate 28 is as a switch, which creates the charge transfer channel when appropriately biased.

SUMMARY OF THE INVENTION

However, the present inventors recognized several disadvantages inherent in the pinned photodiode technology described in the prior art. First, precise manufacturing steps are crucial for proper performance of the pinned photodiode. While the pinning dopant region 20 and the n-well 22 are self-aligned with one another, a small misalignment between the transfer gate and the underlying n-wells 22 and 26 will drastically impair device performance. If the transfer gate 28 does not extend to the edges of both the n-wells 22 and 26, then there will be a p-type barrier to charge transfer, which can significantly reduce or eliminate the charge transfer, even when the transfer gate is fully biased. Second, some of the photoelectrons that otherwise would have reached the photodiode's n-well 22 are instead collected by other circuitry (e.g. detection circuitry) in the proximity of the collection junction. In other words, the effective fill factor of the n-well 22 is rather limited because photoelectrons which would otherwise contribute to the signal are captured by the potential wells of the surrounding circuitry. And third, while low capacitance photodiodes have low kTC noise levels and high transfer efficiencies which minimize "ghost" images, they also have small areas, and thus small light collection volumes.

The present invention provides an alternative device structure which overcomes the disadvantages of the devices described in the prior art while achieving some of their favorable characteristics. By utilizing a dual-purpose electrode (rather than a transfer gate) which extends beyond the edge of the collection photodiode, the present invention overcomes the sensitivity of device performance on small misalignments between manufacturing steps. Furthermore, the collection-mode potential of the dual-purpose electrode can be adjusted to achieve charge confinement and enhanced collection efficiency, reducing or eliminating the need for the additional p+ dopant layer found in the prior art. Finally, the present invention enhances the fill factor of the photodiode by shielding the photon-created charge carriers formed in the substrate from the potential wells of the surrounding circuitry.

One aspect of the present invention involves a detector of electromagnetic radiation. The detector has a semiconductor substrate with dopants of a first conductivity type at a first concentration density, and an insulating layer at its surface. A collection region with dopants of a second conductivity type opposite the first conductivity type at a second concentration density is formed in the surface region of the semiconductor substrate. A dual-purpose electrode is formed on the insulating layer, extending over both the surface of at least part of the collection region and over at least part of the substrate. Preferably, the collection region forms a junction with the semiconductor substrate. In one embodiment, the junction formed is a photodiode.

In one embodiment, the substrate further has a barrier region of the first conductivity type with a concentration density of dopants being higher than the concentration density of dopants in the substrate. In another embodiment, the barrier region extends at least partly under the dual purpose electrode. In yet a further embodiment, a detection region with dopants of the second conductivity type at a third concentration density is formed in the surface region of the semiconductor substrate, not bordering the collection region and being connected to read-out electronics.

In another embodiment, the surface regions of the semiconductor substrate beyond the collection region are barrier regions which have dopants of the first conductivity type at a concentration density larger than the concentration density of the semiconductor substrate, and the read-out electronics formed within shielding regions. Preferably, at least part of the charge carriers that are generated in the semiconductor substrate underneath the shielding regions are collected by the collection region.

In yet another embodiment, a pinning region with dopants of the first conductivity type at a fourth concentration density is within the surface region. Preferably, the pinning region is not covered by the dual purpose electrode. In one embodiment, the pinning region is aligned with the dual-purpose electrode, and extends along the collection region.

Another aspect of the present invention involves a method of making a detector of electromagnetic radiation. The method involves providing a semiconductor substrate with dopants of a first conductivity type at a first concentration density, and with an insulating layer at its surface, forming a collection region by introducing dopants of a second conductivity type which is opposite the first conductivity type at a second concentration density region into the surface region of the semiconductor substrate, and forming a dual-purpose electrode on the insulating layer with the dual-purpose electrode extending over the surface of the collection region.

DETAILED DESCRIPTION OF THE PREFERRED EMBODIMENTS

The present invention is applicable to any active or passive pixel structures.

Figure 1:
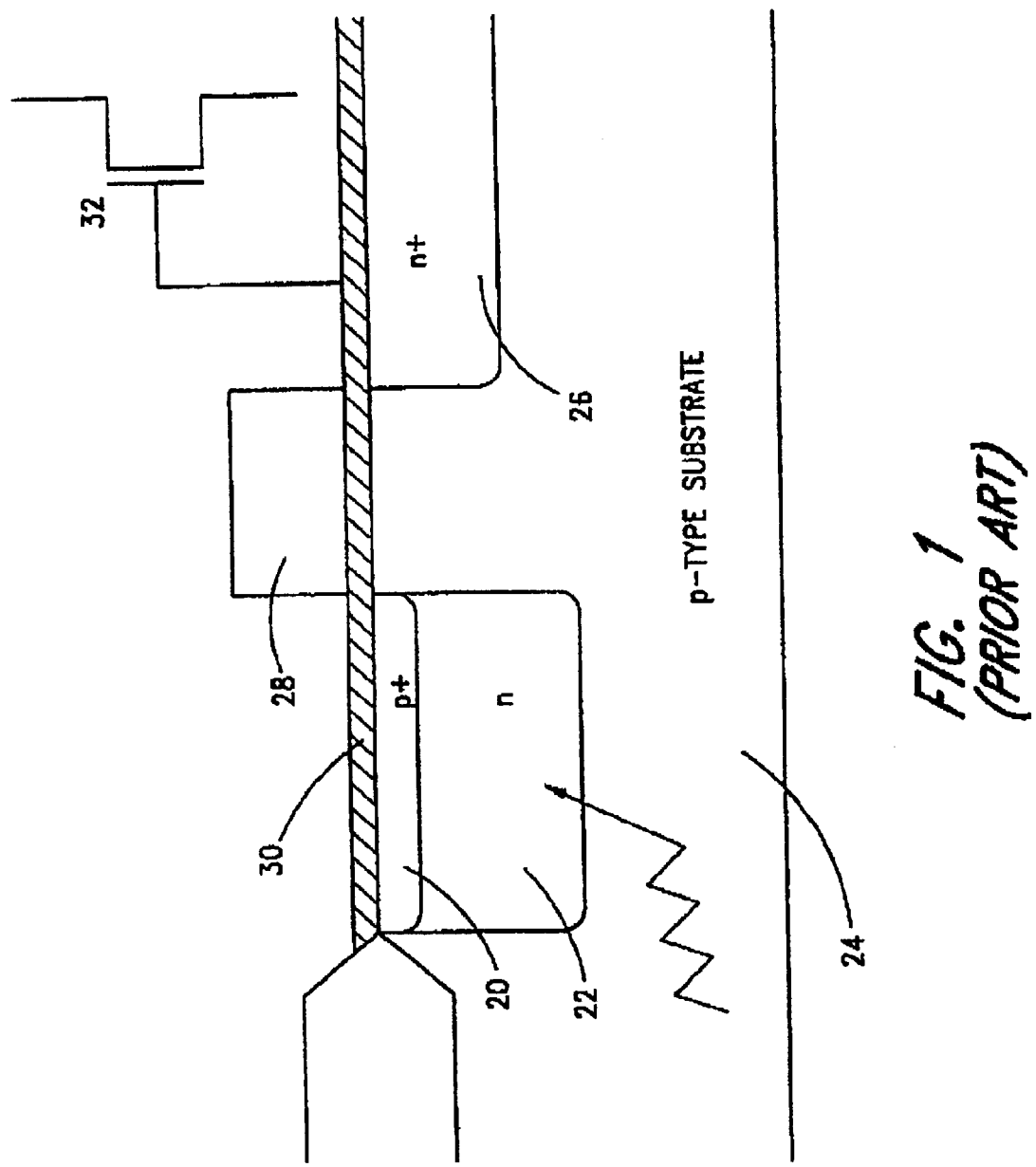
FIG. 1 illustrates a prior art pinned-diode photodiode assembled on a p-type semiconductor substrate.
Figure 2:
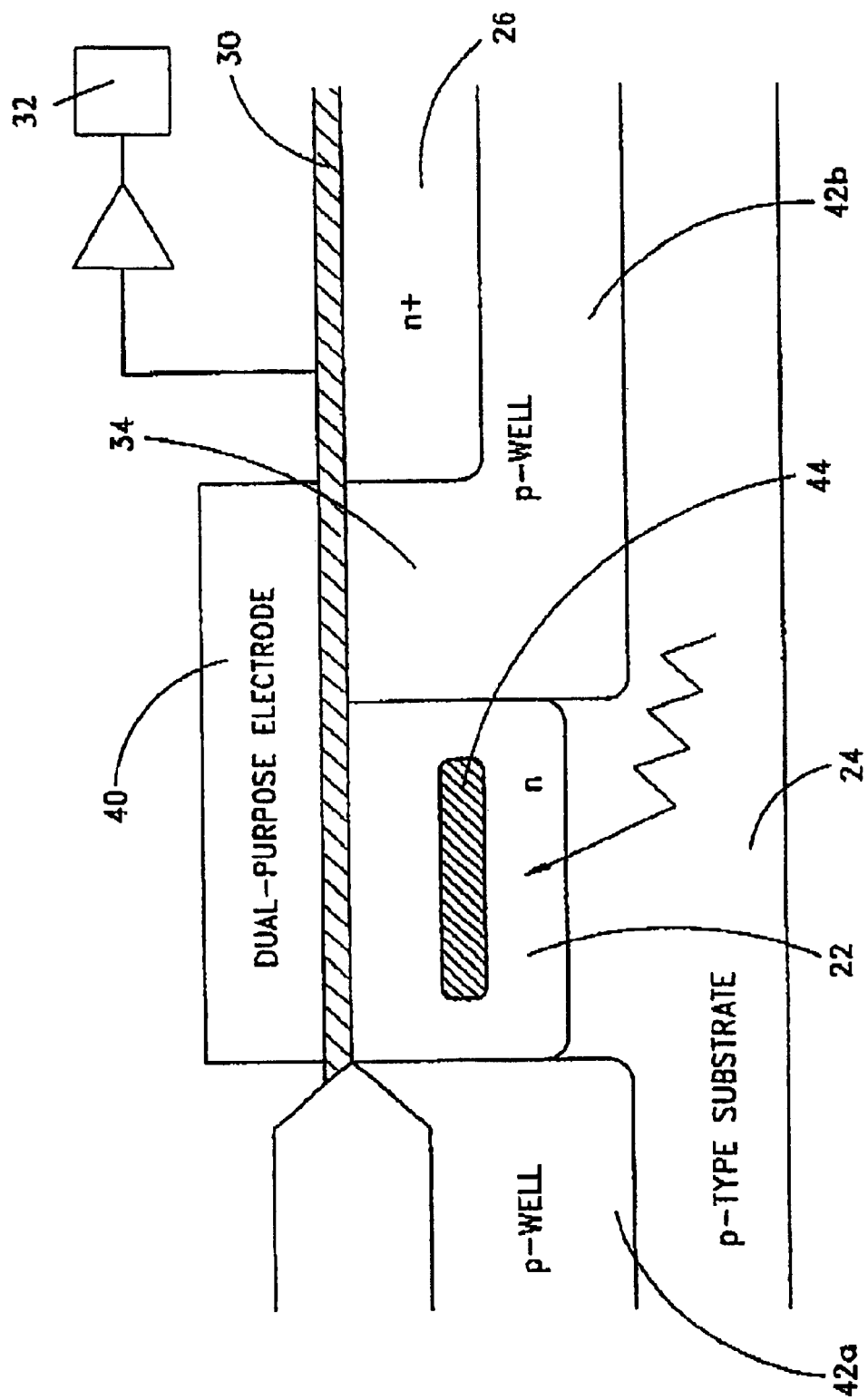
FIG. 2 illustrates a detector of electromagnetic radiation in accordance with a first embodiment of the present invention with a dual-purpose electrode.

FIG. 2 illustrates a first embodiment of a detector of electromagnetic radiation of the present invention formed in a semiconductor substrate 24 with dopants of a first conductivity type at a first concentration density. In the preferred embodiment of FIG. 2, the semiconductor substrate 24 is a p-type silicon substrate. An insulation layer 30, such as silicon dioxide $SiO_2$, is specifically formed on the substrate surface. As depicted in FIG. 2, the detector has a collection region 22 formed in the surface region of the semiconductor substrate 24, with dopants of a second conductivity type which is opposite to the first conductivity type at a second concentration density. This collection region 22 is illustrated in FIG. 2 to be an n-well, and it forms a photodiode junction with the semiconductor substrate 24. The detector has a first shielding region 42a and a second shielding region 42b, each which have dopants of the first conductivity type at a concentration density larger than the concentration density of the semiconductor substrate 24. As illustrated in FIG. 2, the shielding regions 42a, b are two p-wells. In the second shielding region 42b, a detection region 26 is formed in the surface region of the semiconductor substrate 24 with dopants of the second conductivity type at a third concentration density. This detection region 26 does not border the collection region 22, and it is coupled to detection circuitry 32. The detection region 26 and the collection region 22 define a barrier region 34 between them. In FIG. 2, this detection region 26 is an n-plus well, and the barrier region 34 is part of the shielding region 42b which borders the collection region 22. A dual-purpose electrode 40 is formed on the insulation layer 30, extending over the surface of the collection region 22, and fully across the barrier region 34 to the edge of the detection region 26.

Persons skilled in the art recognize that the first conductivity type can be either n-type or p-type, and that there are many values of the first, second, and third concentration densities which are compatible with the present invention. The shielding regions 42a, 42b, the collection region 22 and the detection region 26 are all formed using techniques well understood in the art, such as diffusion or implantation. Similarly, the dual-purpose electrode 40 and insulation layer 30 are formed in conventional manners. The dual-purpose electrode 40 extends across the surface of the collection region 22, and fully across a portion of the shielding region 42b which extends to the surface of the substrate 24. The dual-purpose electrode 40 extends across the identified portion of the shielding region 42b to an edge of the detection region 26. The photocollection junction of the present invention can be a photodiode, but also a junction that consists essentially of a depletion layer or inversion layer to the semiconductor substrate (e.g. surface channel CCD), or that consists essentially of a (partially) depleted buried channel to the semiconductor substrate or surface (e.g. buried channel CCD). Such structures are typically used in CCDs, charge injection devices, photogates, or similar structures. These are called "virtual junctions," since they have the same functionality as a physical n-p junction while collecting photogenerated charge carriers.

The shielding regions 42a, b shield the photoelectrons created in the substrate 24 from the potential of any oxide regions or detection regions 26. The electrostatic barrier formed at the interface between the shielding regions 42a, b and the substrate 24 prevents charges generated underneath the shielding regions 42a, b from diffusing into the junctions or other structures of the active pixel's additional electronics. There is no such electrostatic barrier present underneath the collection region 22, so it can consequently gather charges that are generated under the other electronic components. The collection junction of the preferred embodiment has a near 100% fill factor, which means that nearly the whole surface of the pixel that is exposed to light contributes to the pixel's detected signal. Therefore, the photodiode can have a small junction area and a small capacitance, while having a large collecting volume.

When the substrate 24 is exposed to light, electrons are present. When the dual-purpose electrode 40 is at a low voltage, it causes an electrostatic potential which collects electrons created in the substrate 24 to a region 44 of the collection region 22. The confinement minimizes the recombination of the collected charges with the electronic states of the surface of the collection region 22. Additionally, this confinement reduces the influence of any oxide layer charge on the junction potential.

When the dual-purpose electrode 40 is biased to a high voltage, the charge collected in the collection region 22 flows into the detection region 26 through an inversion layer created in the shielding region 42b underneath the dual-purpose electrode 40. The high bias of the dual-purpose electrode 40 also reduces the capacitance of the photodiode during the charge transfer to the detection region 26 by making the potential well in the photodiode more shallow. This reduction of capacitance permits faster and more complete charge transfer of the collected charge to the detection region 26. Therefore, the signal from this preferred embodiment has a small kTC noise component, and the possibility of "ghost" images is reduced.

The structure and functionality of the dual-purpose electrode of the preferred embodiment illustrated in FIG. 2 is different from the transfer gate of the prior art configurations. The dual-purpose electrode of the preferred embodiment of FIG. 2 enhances the collection and retention of the photoelectrons, creates the inversion layer for transfer of the collected charge into the detection circuitry, and facilitates this transfer by reducing the capacitance of the photodiode.

While complete charge transfer from the photodiode's collection region 22 of FIG. 2 to the detection region 26 of FIG. 2 is possible in theory, practically there are effects that may cause incomplete charge transfer: The complete transfer does not only depend on the voltage or voltage pulse applied to the gate 40, but also on the voltage present at the receiving node 26 in FIG. 2. Normally the $V_{th}$ at the n doped side of the electrode is lower than at the p-doped side. This effect also is a reason that an amount of charge is retained in the n-region after transfer. As the amount of retained charge is rather constant, it can be neglected in normal sensor operation. This effect is also counteracted by increasing the voltage at 26 and/or making the p-doped part of the electrode shorter: the resulting electric field will facilitate the transfer of electrons.

Figure 3:
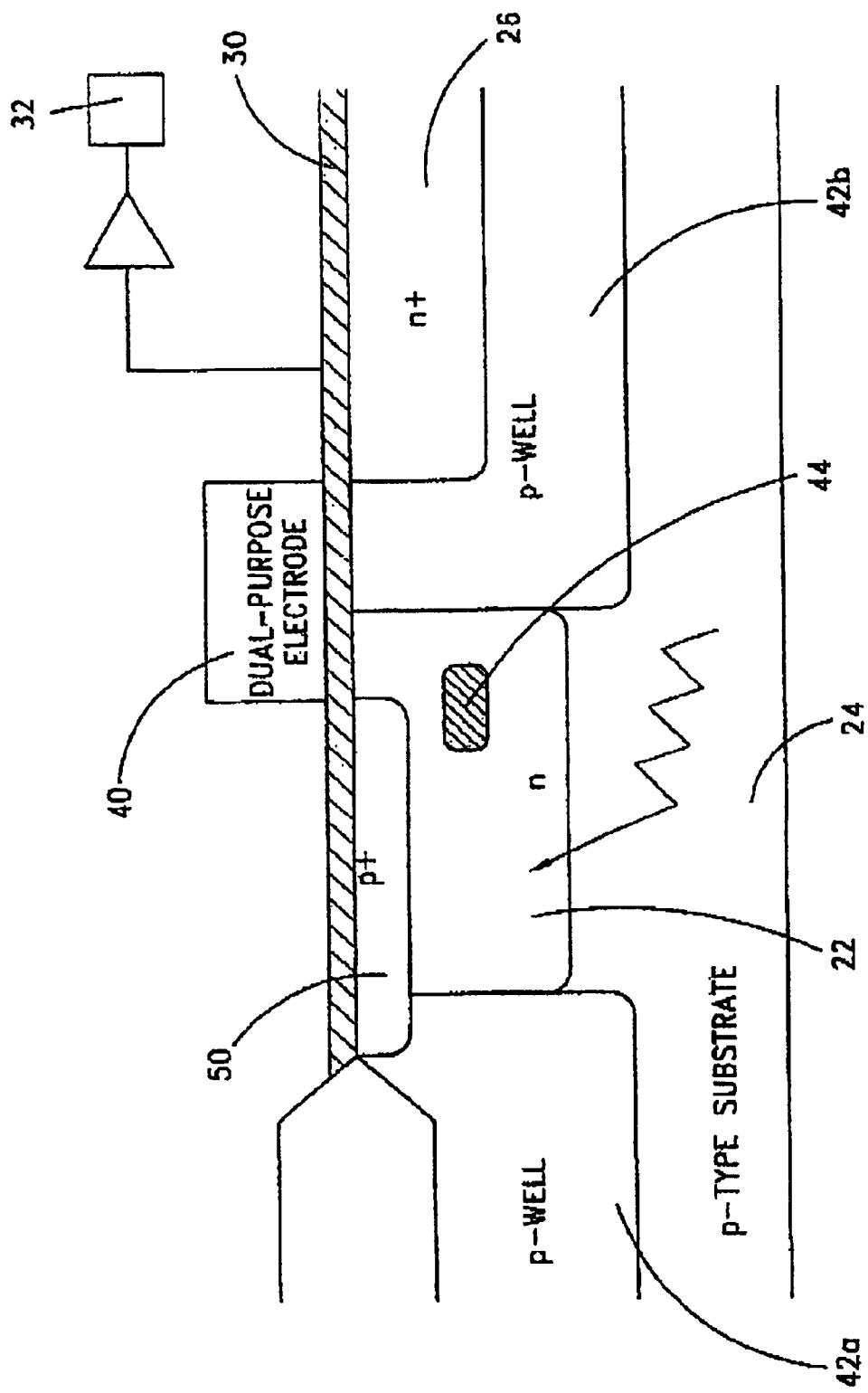
FIG. 3 illustrates a detector in accordance with a second embodiment of the present invention.

In another embodiment of the photodiode of the present invention, as illustrated in FIG. 3, the dual-purpose electrode 40 is shorter and is used in conjunction with an pinning, p-type, region 50 with dopants of the first conductivity type at a fourth concentration density at the surface of the photodiode's collection region 22. Persons skilled in the art recognize that there are many values of the concentration density of the pinning region 50 which are compatible with the present invention, and that the pinning region 50 is formed using techniques well understood in the art, such as diffusion or implantation. The dual-purpose electrode 40 extends significantly across the portion of the collection region 22 which extends to the surface of the substrate 24. The remaining surface of the collection region 22 has the pinning region 50. Confinement of the collected charge is accomplished primarily by the dual-purpose electrode 40, which is set at an appropriate bias to confine the collected photoelectrons in a volume beneath the dual-purpose electrode 40. Because the potential underneath the inversion region 50 is in most cases lower than that underneath the dual-purpose electrode 40, collected charges flow to an area 44 underneath the dual-purpose electrode 40 where they are stored. When the dual-purpose electrode 40 is pulsed or biased to a high voltage, the charge collected in the collection region 22 flows into the detection region 26 through an inversion layer created in the shielding region 42b underneath the dual-purpose electrode 40. The dual-purpose electrode 40 of the preferred embodiment in FIG. 3 thereby provides the same advantages as it does in the preferred embodiment of FIG. 2.

In addition, the pinning region 50 effectively reduces the dark current of the photodiode and increases its ionization radiation tolerance by shielding the detection region 26 from electrons thermally generated at the surface or Si—SiO$_2$ interface. Such an inversion region 50 thereby permits a photodiode with a larger collection area than would otherwise be feasible.

Figure 4:
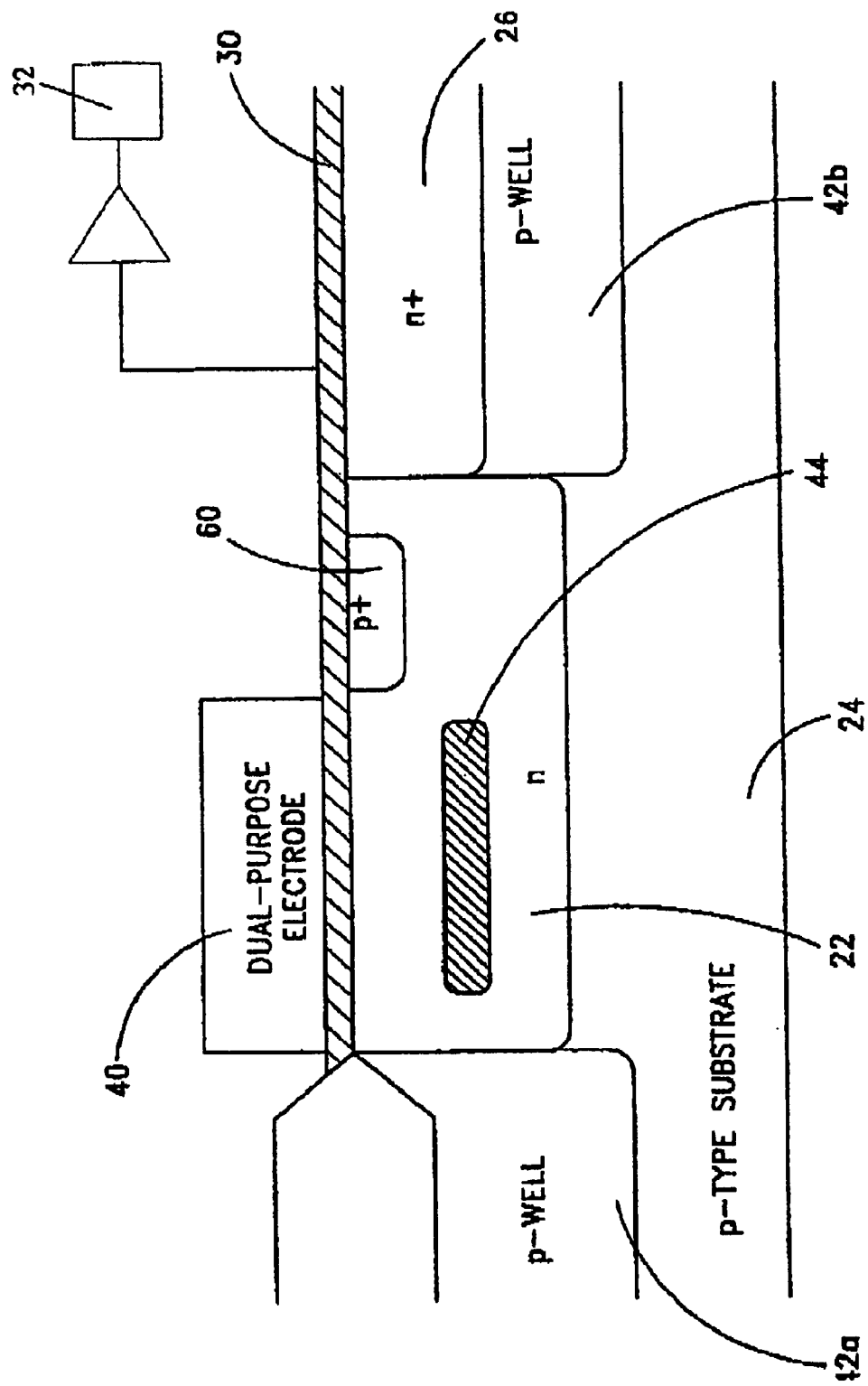
FIG. 4 illustrates a detector in accordance with a third embodiment of the present invention.

In another preferred embodiment, as illustrated in FIG. 4, the dual-purpose electrode 40 is used in conjunction with a p-type region 60. In contrast to the embodiment of FIG. 3, the embodiment illustrated in FIG. 4 has the p-type region 60 situated to the right of the dual-purpose electrode 40 at the surface of a photodiode's collection region 22; i.e. between the (single-purpose) electrode 40 and the detection region 26. As in the embodiment illustrated in FIG. 3, the collected charge is collected in a potential pocket 44 underneath the electrode 40 that is electrostatically induced by the electrode's 40 high bias. However, the electrode 40 is not used to form a channel through which the collected charge is transferred to the detection circuitry 32. Such a channel is actually the n-type region under the p-type region 60.

In the embodiment illustrated in FIG. 4, upon reduction of the bias of electrode 40, the potential in the region 44 drops, until it drops below the potential underneath the p-type region 60. The charge will then flow to the higher potential of the detection region 26. Since there is no barrier region to be traversed by the collected charge, there is no need for a dual-purpose electrode to create an inversion layer. The electrode 40 serves both as a confinement of the collected charge, and as a release element allowing the charge to flow to the detection region 26. In this preferred embodiment, special care must be taken to ensure that there is no unintended barrier regions formed due to misalignment which would prevent charge transfer to the detection circuitry 32. Region 60 is a barrier, that has a fixed potential height. As soon as the potential in 44 drops below it, charge carriers from 44 flow to 26.

Although described above in connection with particular embodiments of the present invention, it should be understood that the descriptions of the embodiments are illustrative of the invention and are not intended to be limiting. Various modifications and applications may occur to those skilled in the art without departing from the true spirit and scope of the invention as defined in the appended claims.

What is claimed is:

1. A CMOS pixel structure comprising:
    a semiconductor substrate with dopants of a first conductivity type at a first concentration density, and with an insulating layer at its surface;
    a collection region with dopants of a second conductivity type which is opposite the first conductivity type at a second concentration density, formed in the surface region of the semiconductor substrate;
    a barrier region of the first conductivity type in the substrate, with a concentration density of dopants being higher than the concentration density of dopants in the substrate;
    a dual-purpose electrode formed on the insulating layer, extending over both the surface of at least part of the collection region and over at least part of the substrate, the dual-purpose electrode being intended to be driven by a first voltage that causes an electrostatic potential which collects in an area of the collection region beneath the dual-purpose electrode charges generated by electromagnetic radiation and by a second voltage, which is higher than the first voltage, for transferring the charges from the collection region into a detection region, and
    the pixel structure being an active pixel structure having an amplifier integrated in the pixel structure and coupled to the detection region for amplifying the collected charge.

2. The pixel structure recited in claim 1 wherein said barrier region is extending at least partly under the dual-purpose electrode.

3. The pixel structure recited in claim 1 further comprising a detection region with dopants of the second conductivity type at a third concentration density, formed in the surface region of the semiconductor substrate and not bordering the collection region and being connected to read-out electronics.

4. The pixel structure recited in claim 1, wherein the collection region forms a junction with the semiconductor substrate.

5. The pixel structure recited in claim 4, wherein the junction formed is a photodiode.

6. The pixel structure recited in claim 1, wherein the surface regions of the semiconductor substrate beyond the collection region are barrier regions which have dopants of the first conductivity type at a concentration density larger that the concentration density of the semiconductor substrate and read-out electronics are formed within shielding regions.

7. The pixel structure recited in claim 6, wherein at least part of the charge carriers that are generated in the semiconductor substrate underneath the shielding regions are collected by the collection region.

8. The pixel structure recited in claim 1, wherein a pinning region with dopants of the first conductivity type at a fourth concentration density is within the surface region.

9. The pixel structure recited in claim 8, wherein the pinning region is not covered by the dual-purpose electrode.

10. The pixel structure recited in claim 9, wherein the pinning region is aligned with the dual-purpose electrode, and extends along the collection region.

11. The pixel structure according to claim 1, wherein the barrier region substantially impedes the diffusion of charges to said detection region.

* * * * *